United States Patent
Steger

(10) Patent No.: US 6,770,852 B1
(45) Date of Patent: Aug. 3, 2004

(54) CRITICAL DIMENSION VARIATION COMPENSATION ACROSS A WAFER BY MEANS OF LOCAL WAFER TEMPERATURE CONTROL

(75) Inventor: Robert J. Steger, Los Altos, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/376,498

(22) Filed: Feb. 27, 2003

(51) Int. Cl.[7] ................................................. F27B 5/14
(52) U.S. Cl. ....................... 219/390; 219/405; 219/411; 118/724; 118/725; 118/50.1; 392/416
(58) Field of Search ................................ 219/390, 405, 219/411; 392/416, 418; 118/724, 725, 50.1

(56) References Cited

U.S. PATENT DOCUMENTS

| | | | | |
|---|---|---|---|---|
| 4,518,848 A | | 5/1985 | Weber | 219/388 |
| 5,059,770 A | * | 10/1991 | Mahawili | 219/391 |
| 5,294,778 A | | 3/1994 | Carman et al. | 219/385 |
| 5,539,179 A | | 7/1996 | Nozawa et al. | 219/121.43 |
| 5,846,375 A | * | 12/1998 | Gilchrist et al. | 156/345 |
| 5,854,468 A | | 12/1998 | Muka | 219/443 |
| 5,925,227 A | | 7/1999 | Kobayashi et al. | 204/298.25 |
| 6,080,969 A | | 6/2000 | Goto et al. | 219/444.1 |
| 6,080,970 A | | 6/2000 | Yoshida et al. | 219/444.1 |
| 6,084,215 A | | 7/2000 | Furuya et al. | 219/444.1 |
| 6,310,755 B1 | | 10/2001 | Kholodenko et al. | 361/234 |
| 6,365,879 B1 | | 4/2002 | Kuibira et al. | 219/444.1 |
| 6,379,222 B2 | | 4/2002 | Wise et al. | 451/41 |
| 6,561,706 B2 | * | 5/2003 | Singh et al. | 396/611 |

* cited by examiner

*Primary Examiner*—Shawntina Fuqua
(74) *Attorney, Agent, or Firm*—Thelen Reid & Priest LLP; Thierry K. Lo

(57) ABSTRACT

A wafer etching system has a measuring device, an etching chamber, and a controller. The measuring device measures the critical dimension test feature (CD) along the profile of the wafer at a number of preset locations. The etching chamber receives the wafer from the measuring device. The etching chamber includes a chuck supporting the wafer and a number of heating elements disposed within the chuck. Each heating element is positioned adjacent to one of the preset locations on the wafer. The controller is coupled to the measuring device to receive the actual measured CD's for a particular wafer. The controller is also coupled to control the heating elements. The controller adjusts the temperature of each heating elements during a process to reduce so as the variation of critical dimensions measured at the preset locations.

17 Claims, 3 Drawing Sheets

CRITICAL DIMENSION VARIATION COMPENSATION ACROSS A WAFER BY MEANS OF LOCAL WAFER TEMPERATURE CONTROL

CROSS-REFERENCES

The present application is related to U.S. patent application Ser. No. 09/846,432, filed Apr. 30, 2001, in the name of inventors Neil Benjamin and Robert Steger, entitled "Method and Apparatus for controlling the spatial temperature distribution across the surface of a workpiece support", commonly assigned herewith. The present application is also related to U.S. patent application Ser. No. 10/062,395, filed Feb. 1, 2002, in the name of inventors Neil Benjamin and Robert Steger, entitled "Method and Apparatus for controlling the spatial temperature distribution across the surface of a workpiece support", commonly assigned herewith.

FIELD OF THE INVENTION

The present invention relates to a method and apparatus for varying a temperature profile for a wafer of material undergoing plasma processing in order to compensate for other non-temperature effects that cause dimensional variation of etched features across the substrate during plasma processing.

BACKGROUND OF THE INVENTION

A typical plasma etching apparatus comprises a reactor in which there is a chamber through which reactive gas or gases flow. Within the chamber, the gases are ionized into a plasma, typically by radio frequency energy. The highly reactive ions of the plasma gas are able to react with material, such as a polymer mask on a surface of a semiconductor wafer being processed into integrated circuits (IC's). Prior to etching, the wafer is placed in the chamber and held in proper position by a chuck or holder, which exposes a top surface of the wafer to the plasma. The chuck provides an isothermal surface and serves as a heat sink for the wafer. There are several types of chucks (also sometimes called susceptors) known in the art. In one type, a semiconductor wafer is held in place for etching by a mechanical clamp. In another type of chuck, a semiconductor wafer is held in place by an electrostatic force generated by an electric field disposed between the chuck and the wafer. The present invention is applicable to both these types of chucks.

In a typical plasma etching operation, the reactive ions of the plasma chemically react with portions of material on a face of the semiconductor wafer. In most cases, it is highly desirable that etched features be uniform to a nearly perfect degree since otherwise the ICs being fabricated will have electronic characteristics that deviate from the norm more than is desirable. Variations in the photolithography process as well as variations in the etching process can cause variation from the ideal in etched feature dimensions. Furthermore, with each increase in the size of wafer diameter, the problem of ensuring uniformity of ICs from within larger and larger wafers becomes more difficult. Variations in the lithography process result in non-ideal dimensions in the photoresist mask, which is laid down on the wafer surface to define the etching pattern. This deviation from ideal can be viewed as an overall shift of the mean feature dimensions as well as the variation among the numerous features throughout the wafer surface.

It is common practice to define test images in multiple locations over the wafer surface, and these test images are often referred to as "critical dimension features" or "CD's" for short. A measurement of these CD's after the photo imaging process can be used to determine the "CD shift" from the lithography operation. Likewise a measurement of the CD's in the photoresist can be compared to the etched features that they define after the etching process, and a CD shift can be calculated and attributed to the etch process. It is desirable that these CD shifts be stable from wafer to wafer and uniform over a wafer surface, so that a simple correction bias to the original mask image can be used to compensate out the systematic CD shift.

Historically such global shift correction was feasible, but with the reduction in IC minimum feature dimensions to 0.10 microns and below, the shift is no longer sufficiently controllable, either globally or within a wafer, making the previous simple mask correction inadequate. What is required is a means to measure CD shift in the photoresist mask, perhaps by lot or even by individual wafer, and use this information to alter the CD shift within the etch process.

It has been known that plasma etching is a combination process of both etching and deposition. The deposition process on the feature sidewalls allows control of the feature width. This process is temperature dependent but at the larger dimensions of the past, for example, greater than 2 micron, the effect was not of significance with regard to linewidth control. However, as dimensions fall below about 0.1 micron, this temperature dependence has come to have a significant effect upon feature width control.

Accordingly, a need exists for a method and apparatus for controlling the temperature of semiconductor wafers during reactive ion etching and similar processes based on the particular feature dimensions on a wafer. A primary purpose of the present invention is to solve these needs and provide further, related advantages.

BRIEF DESCRIPTION OF THE INVENTION

An etching system for etching a wafer of a material has a measuring device, an etching chamber, and a controller. The measuring device measures the critical dimension test feature (CD) along the profile of the wafer at a plurality of preset locations. The etching chamber receives the wafer from the measuring device. The etching chamber includes a chuck supporting the wafer and a plurality of heating elements disposed within the chuck. Each heating element is positioned adjacent to each preset location on the wafer. The etching system controller is coupled to the measuring device to receive the actual measured CD's for a particular wafer. The etching system controller is also connected to the plurality of heating elements. The controller adjusts the temperature of each heating element during a process to reduce the variation of critical dimensions among the plurality of preset locations by using temperature dependent etching characteristics of the etch process to compensate for CD variation introduced by the lithography process preceding the etch process.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of a system for reducing surface profile variations on a wafer by means of local wafer temperature control. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 2:
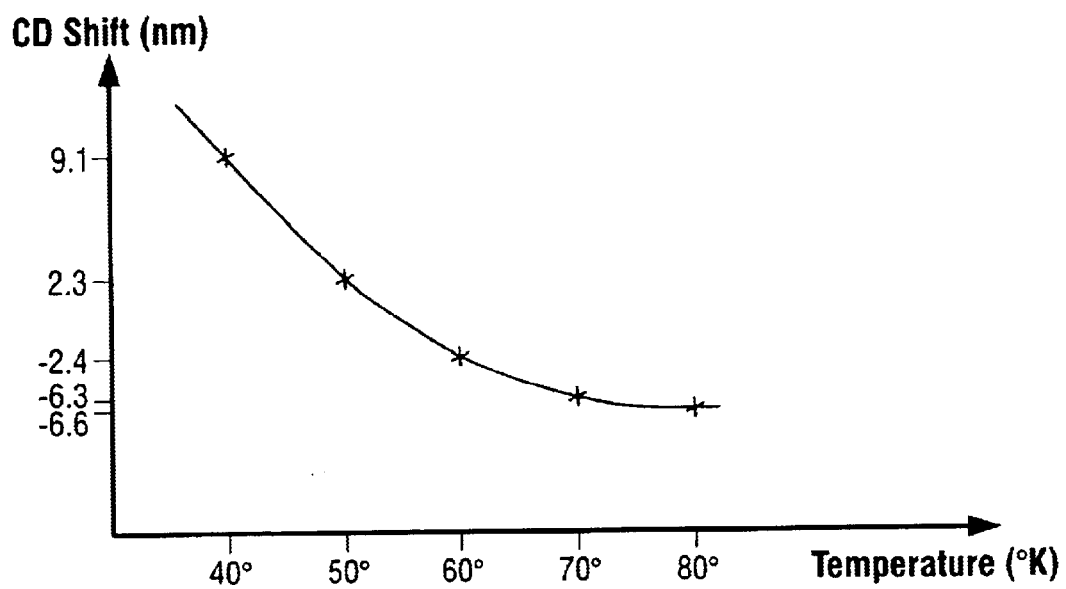
FIG. 2 is a graph of an example of the relationship between etch process induced CD shift and wafer temperature in accordance with one embodiment of the present invention.

By altering the wafer temperature in accordance with FIG. 2 (or its equivalent for the photoresist and etching chemistries in use) this temperature dependant CD shift in the etching process can be used to compensate the photolithographic induced CD shifts in each wafer or lot of wafers to generally improve the final CD's fidelity to the intended dimensions.

In the near future it is expected that a single global correction, even if performed on each wafer individually, will be inadequate to correct CD shifts which result from the photolithography process. As such, the wafer can be divided into several segments and multiple local CD shifts can be calculated. Using this data and the curve in FIG. 2, a multizone-heated pedestal can be used to perform CD shift corrections locally on a wafer.

Figure 1:
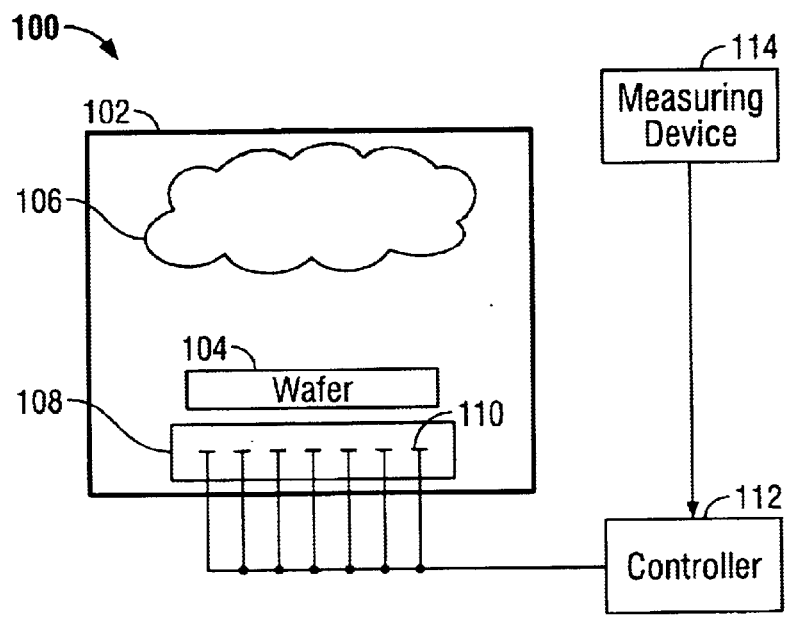
FIG. 1 is a schematic diagram illustrating a system for controlling the temperature and etch rate of the wafer under process in accordance with one embodiment of the present invention.

FIG. 1 illustrates an etching system 100 for controlling the temperature and etch rate of a wafer 104 in accordance with one embodiment of the present invention. An etching system 100 comprises a chamber 102 through which reactive, gas or gases flow (not shown). Within the chamber 102, the gases are ionized into a plasma 106, by radio frequency energy generated by an RF antenna (not shown) disposed above and adjacent to a top window (not shown) of the chamber 102. The highly reactive ions of the plasma 106 are able to react with the surface of a semiconductor wafer 104 being processed. Prior to etching, the wafer 104 is placed in the chamber 102 and held in proper position by a chuck 108 that exposes a top surface of the wafer 104 to the plasma 106.

Several heating elements 110 are arranged at preset locations in the chuck 108. For illustration purposes, the heating elements 110 may include film heaters, or any other type of heaters small enough to fit in the chuck 108. Those of ordinary skills in the art will recognize that there are many other ways to heat the chuck 108. An example of the arrangement of the heating elements 110 is further illustrated below in FIG. 3. The heating elements 110 are coupled to a controller 112 that adjusts the temperature of each heating element 110.

A measuring device 114 coupled to the controller 112 measures critical dimension test feature dimensions (CDs) on each wafer prior to processing. Critical Dimensions metrology tools may be used to detect and measure changes in feature profiles. For illustration purposes, the measuring device 114 may include a spectroscopic CD metrology tool that is based on spectroscopic ellipsometry (SE) which is an optical technique for measuring film thickness and film properties. The measuring device 114 may determine the CD (at any point on the profile), line height or trench depth, and sidewall angle from spectroscopic CD measurements on special grating targets. The cross-section profile of a wafer may also be determined. The measuring device 114 sends data containing measurements at several preset locations on the wafer 104 to the controller 112. The locations of the measurements may be chosen according to the number of measurements. The preset locations on the wafer 104 correspond to independent thermal regions on the chuck 108. Those of ordinary skill in the art will appreciate that the above spectroscopic CD metrology tool discussed above is not intended to be limiting and that other measuring tools can be used without departing from the inventive concepts herein disclosed.

The controller 112 includes an algorithm containing the relationship between a feature dimension measurement and the temperature of a wafer under process. For illustration purposes, FIG. 2 is a graph of an example of the relationship between CD shift and wafer temperature. Such relationship may be obtained, for example, from empirical data. Once the controller 112 receives the data from the measuring device 114, the controller 112 applies the above algorithm to translate the measured data into temperature data. Therefore, the data containing measurements at several locations on the wafer 104 may be used to produce a custom temperature profile for the measured wafer 104. Thus, for a particular measurement at a particular location on the wafer 104, the controller 112 adjusts the temperature of the heating element 110 corresponding to that particular location on the wafer in accordance with the above-defined relationship.

Thus, the etching system 100 includes a feedforward system in which it dynamically alters in real-time the temperature profile for each wafer after accepting information about the particular feature dimensions on the wafer. The controller 112 adjusts the temperature of each heating element 110 before and/or during the process to reduce the variation of Critical Dimensions on the wafer 104 among the preset locations on the wafer 104.

Figure 3:
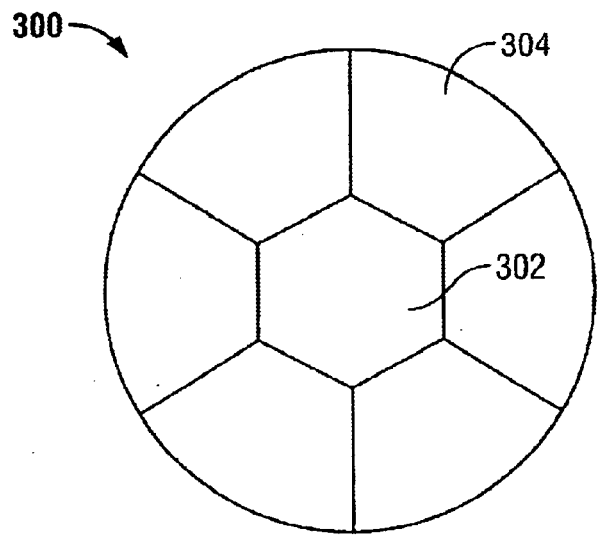
FIG. 3 is a schematic diagram illustrating different regions on a chuck in accordance with one embodiment of the present invention.

The measuring device 114 measures feature dimensions at preset locations on the wafer 104. In particular, the preset locations may be spread over the surface of the wafer 104. Each preset location or a group of preset locations may represent a region on the wafer 104 and the chuck 110. FIG. 3 is a schematic diagram illustrating different regions on a chuck in accordance with one embodiment of the present invention. FIG. 3 illustrates a chuck 300 having seven regions: one central hexagonal region 302 in the center on the chuck 300, six adjacent regions 304 around the central region 302. Those of ordinary skill in the art will appreciate that the regions on the chuck shown are not intended to be limiting and that other configurations of regions or zones can be used without departing from the inventive concepts herein disclosed. Each region on the chuck 300 may correspond to a region on the wafer since the wafer sits on top of the chuck 300. Each region on the chuck 300 may include its own heating element (not shown) and its own controller (not shown) such that the temperature of each region on the chuck 300 may be controlled independently.

The measuring device 114 may measure feature dimensions from several preset locations on the wafer 104. Each region may include at least one preset location from which the measuring device 114 measures feature dimensions on the wafer 104. If more than one preset location exists for a region, the measurements from that region are included in a sample average that represents the average measurement from that region.

For illustration purposes, the etching system 100 may function as follows: The measuring device 114 measures feature dimensions on the wafer 104 at preset locations. Each preset location may define a region on the wafer 104. The controller 112 receives data from the measuring device 114 about the wafer 104 containing feature dimensions at preset locations. The controller 112 translates the data into a temperature profile based on known relationship between the feature dimension differences and the temperature of the wafer during processing. The temperature profile includes a specific temperature for each measured preset location on the wafer 104 and thus for each corresponding region on the chuck 110. The controller 112 thus adjusts the temperature of each region by adjusting its corresponding heating element 110.

Figure 4:
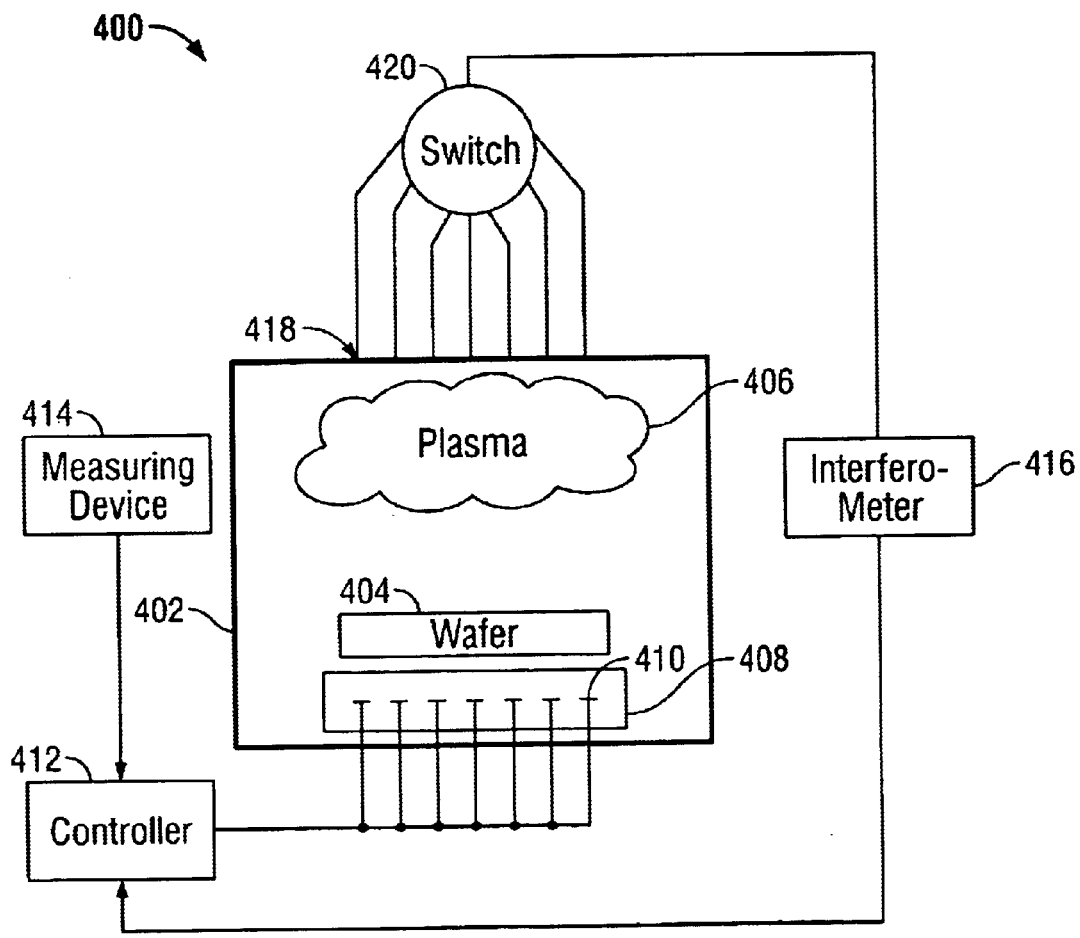
FIG. 4 is a schematic diagram illustrating a system for controlling the temperature and etch rate of the wafer under process in accordance with another embodiment of the present invention.

In accordance with another embodiment of the present invention, FIG. 4 illustrates an etching system 400 for controlling the temperature and etch rate of a wafer 404. The etching system 400 comprises a chamber 402 through which reactive gas or gases flow (not shown). Within the chamber 402, the gases are ionized into a plasma 406, by radio frequency energy generated by an RF antenna (not shown) disposed above and adjacent to a top window (not shown) of the chamber 402. The highly reactive ions of the plasma 406 are able to react with the surface of a semiconductor wafer 404 being processed. Prior to etching, the wafer 404 is placed in the chamber 402 and held in proper position by a chuck 408 that exposes a top surface of the wafer 404 to the plasma 406.

Several heating elements 410 are arranged at preset locations in the chuck 408. For illustration purposes, the heating elements 410 may include film heaters, or any other type of heaters small enough to fit in the chuck 408. The heating elements 410 are coupled to a controller 412 that adjusts the temperature of each heating element 410.

The interferometer 416 samples the etch depth at several preset locations periodically by means of switch 420 which sequentially directs light from one of the several fiber optics 418 to an interferometer 416. Since the time to acquire a spectrum is less than 0.1 seconds, the wafer can be sampled over e.g. seven sites in less than a second.

The controller 412 receives data from the interferometer 416 during processing. The interferometer 416 measures etch depth of the wafer 404 during an etching process. A number of optical fibers 418 aimed at the wafer 404 are positioned on top of the chamber 402. The number of optical fibers 418 corresponds to the number of heating elements 410 in the chuck 408 or to the number of thermal regions in the chuck 408 as illustrated above in FIG. 3. An optical switch 420 relays the information from the fiber optics 418 to the interferometer 416. The optical switch time multiplexes the signals from the wafer 404, region by region, by taking a scan every few milliseconds, for example, 0.1 second.

Thus, the etching system 400 includes an in-situ feedback system in which it dynamically alters in real-time the temperature profile for each wafer based on the information from the interferometer 416. The controller 412 adjusts the temperature of each heating element 410 before and/or during the process to locally modify the etch rates and thereby to reduce the variation of trench etch depth on the wafer 404 among the preset locations on the wafer 404.

Figure 5:
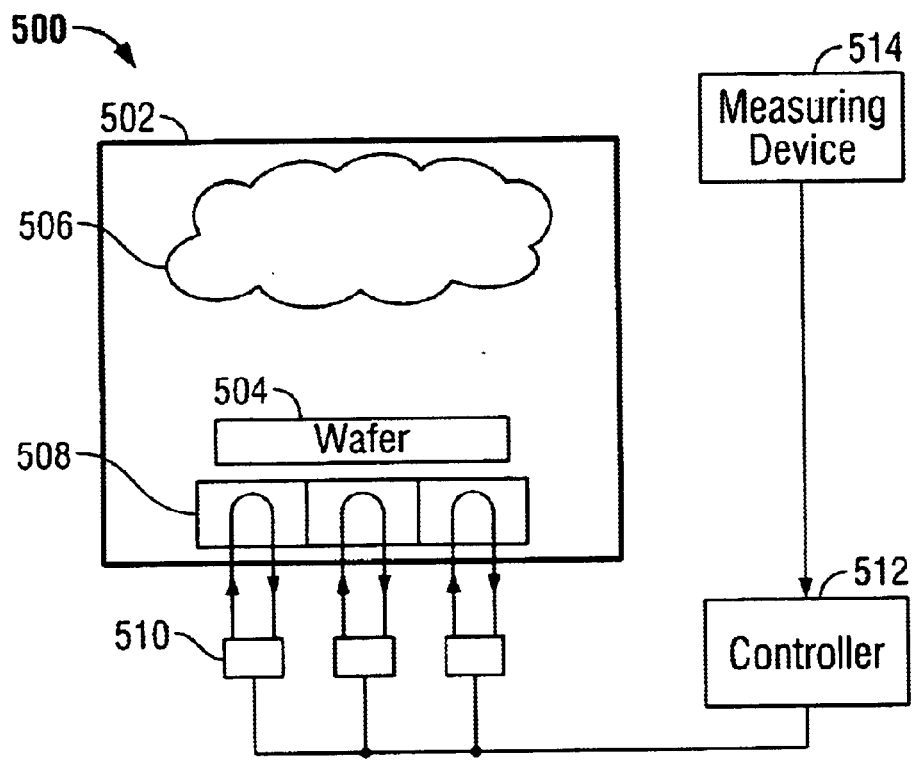
FIG. 5 is a schematic diagram illustrating a system for controlling the temperature and etch rate of the wafer under process in accordance with another embodiment of the present invention.

FIG. 5 is a schematic diagram illustrating a system for controlling the temperature and etch rate of the wafer in accordance with another embodiment of the present invention. An etching system 500 controls the temperature and etch rate of a wafer 504. The etching system 500 comprises a chamber 502 through which reactive gas or gases flow (not shown). Within the chamber 502, gases are ionized into a plasma 506, by radio frequency energy generated by an RF antenna (not shown) disposed above and adjacent to a top window (not shown) of the chamber 502. The highly reactive ions of the plasma 506 are able to react with the surface of a semiconductor wafer 504 being processed. Prior to etching, the wafer 504 is placed in the chamber 502 and held in proper position by a chuck 508 that exposes a top surface of the wafer 504 to the plasma 506.

The chuck 508 may include several distinct regions through which fluid may flow. The temperature of each region may be adjusted independently by controlling the temperature of the fluid passing through each region with a temperature controller 510. Each region may be arranged to correspond with each preset location on the chuck 508. Each temperature controller 510 is coupled to a controller 512 that adjusts each temperature controller 510.

A measuring device 514 coupled to the controller 512 measures critical dimension test feature dimensions (CDs) on each wafer prior to processing. The measuring device 514 sends data containing the measurements at several preset locations on the wafer 504 to the controller 512. The preset locations on the wafer 504 correspond to the different regions on the chuck 508.

The controller 512 includes an algorithm containing the relationship between a feature dimension measurement and the temperature of a wafer under process, similar to the relation shown in FIG. 2. Once the controller 512 receives the data from the measuring device 514, the controller 512 applies the above algorithm to translate the measured data into temperature data. Therefore, the data containing measurements at several locations on the wafer 504 may be used to produce a custom temperature profile for the measured wafer 504. Thus, for a particular measurement at a particular location on the wafer 504, the controller 512 adjusts the temperature of the heating element 510 corresponding to that particular location on the wafer in accordance with the above-defined relationship.

Thus, the etching system 500 includes a feedforward system in which it dynamically alters in real-time the temperature profile for each wafer after accepting information about the particular feature dimensions on the wafer. The controller 512 adjusts the temperature of each heating element 510 before and/or during the process to reduce the variation of Critical Dimensions on the wafer 504 among the preset locations on the wafer 504.

Figure 6:
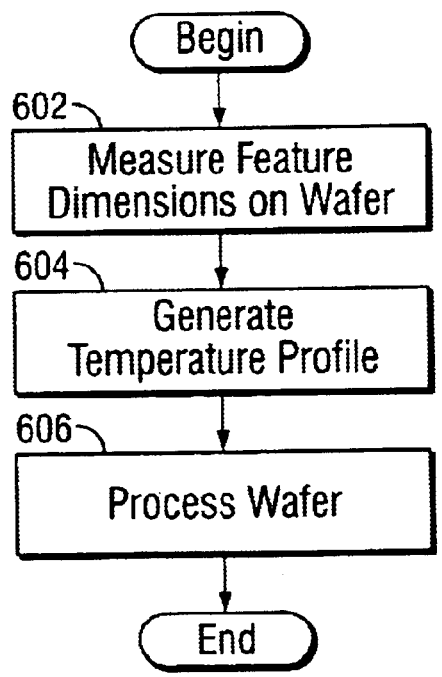
FIG. 6 is a flow diagram illustrating a method for controlling the temperature and etch rate of a wafer under process in accordance with another embodiment of the present invention.

FIG. 6 illustrates a method for utilizing the etching system of FIG. 1. In a first block 602, the measuring device measures critical dimensions or other dimensions at a plurality of locations on a wafer. Each location is associated with a region as discussed above. At 604, the controller generates a temperature profile based on the measured critical dimensions on the wafer. At 606, the plasma etching system processes the wafer positioned on a chuck that has heating elements corresponding with the plurality of locations on the wafer. During the process, the controller adjusts the temperature of the heating elements based on the generated temperature profile.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. An etching system for etching a wafer of a material, comprising:
a measuring device measuring critical dimension test features along the profile of the wafer at a plurality of preset locations;
an etching chamber receiving the wafer from said measuring device, said etching chamber having:
a chuck supporting the wafer,
a plurality of heating elements disposed within said chuck, each heating element positioned adjacent to each preset location on the wafer; and
a controller coupled to said measuring device and said plurality of heating elements, said controller adjusting the temperature of each heating element during a process to reduce the variation of etched features among said plurality of preset locations.

2. The etching system of claim 1 wherein said plurality of preset locations is grouped into a plurality of contiguous regions substantially covering the total surface of the wafer, each region associated with one heating element from said plurality of heating elements.

3. The etching system of claim 2 wherein the surface of the wafer includes a central region and a plurality of contiguous regions adjacent to said central region.

4. The etching system of claim 1 wherein said measuring device includes a spectroscopic Critical Dimension (CD) measurement system.

5. An etching system for etching a wafer of a material comprising:
a measuring device measuring critical dimension test features along the profile of the wafer at a plurality of preset locations;
an etching chamber receiving the wafer from said measuring device, said etching chamber having:
a chuck supporting the wafer, and
a plurality of heating elements disposed within said chuck, each heating element positioned adjacent to a corresponding preset location on the wafer;
a controller coupled to said measuring device and said plurality of heating elements, said controller independently adjusting the temperatures of the heating elements during a process to reduce variation of etched features at said corresponding preset locations; and
a plurality of sensors coupled to said controller, the sensors periodically measuring an average trench depth in a local area on the surface of the wafer for each preset location,
wherein said controller computes a local etch rate for each preset location based on said measured trench depth, and said controller independently adjusts the temperatures of the heating elements during a process to reduce the variation of local etch rates among said plurality of preset locations.

6. An etching system for etching a wafer of a material comprising:
a measuring device measuring critical dimension test features along the profile of the wafer at a plurality of preset locations;
an etching chamber receiving the wafer from said measuring device, said etching chamber having:
a chuck supporting the wafer, and
a plurality of heating elements disposed within said chuck, each heating element positioned adjacent to a corresponding preset location on the wafer;
a controller coupled to said measuring device and said plurality of heating elements, said controller independently adjusting the temperatures of the heating elements during a process to reduce variation of etched features at said corresponding preset locations; and
a plurality of sensors coupled to said controller, the sensors periodically measuring an average trench depth in a local area on the surface of the wafer for each preset location,
wherein said controller computes a local etch rate for each preset location based on said measured trench depth, and said controller independently adjusts the temperatures of the heating elements during a process to reduce variation of local etch rates at said corresponding preset locations,
wherein said plurality of sensors include an interferometer.

7. A method for etching a wafer of a material comprising:
measuring critical dimension test features along the profile of the wafer at a plurality of preset locations;
heating the underside of the wafer at said plurality of locations;
adjusting said heating during a process to reduce the variation of etched features among said plurality of preset locations.

8. The method of claim 7 wherein said plurality of preset locations is grouped into a plurality of contiguous regions substantially covering the total surface of the wafer, each region associated with one heating element.

9. The method of claim 8 wherein the surface of the wafer includes a central region and a plurality of contiguous regions around said central region.

10. The method of claim 7 wherein said measuring includes using a spectroscopic Critical Dimension (CD) measurement system.

11. A method for etching a wafer of a material comprising:
measuring critical dimension test features along the profile of the wafer at a plurality of preset locations;
heating the underside of the wafer at said plurality of locations;

adjusting said heating during a process to reduce the variation of etched features among said plurality of preset locations;

periodically measuring a trench depth on the surface of the wafer for each preset location;

computing a local etch rate for each preset location based on said measured trench depth; and adjusting said heating during a process to reduce the variation of local etch rates among said plurality of preset locations and thereby reduce the variation in final trench depth across a wafer.

12. An apparatus for etching a wafer of a material comprising:

means for measuring the critical dimension along the profile of the wafer at a plurality of preset locations;

means for heating the underside of the wafer at said plurality of locations;

means for adjusting said heating during a process to reduce the variation of critical dimensions among said plurality of preset locations.

13. The apparatus of claim 12 wherein said plurality of preset locations is grouped into a plurality of contiguous regions substantially covering the total surface of the wafer, each region associated with one heating element.

14. The apparatus of claim 12 wherein the surface of the wafer includes a central region and a plurality of contiguous regions around said central region.

15. The apparatus of claim 14 wherein the shape of each region is hexagonal.

16. An apparatus for etching a wafer of a material comprising:

means for measuring a critical dimension along the profile of the wafer at a plurality of preset locations;

means for heating the underside of the wafer at said plurality of locations;

means for adjusting said heating during a process to reduce variation of said critical dimensions among said plurality of preset locations;

means for periodically measuring a trench depth on the surface of the wafer for each preset location;

means for computing a local etch rate for each preset location based on said measured trench depth; and means for adjusting said heating during a process to reduce the variation of local etch rates among said plurality of preset locations.

17. An etching system for etching a wafer of a material, comprising:

a measuring device measuring critical dimension test features along the a profile of the wafer at a plurality of preset locations;

an etching chamber receiving the wafer from said measuring device, said etching chamber having:
a temperature controlled chuck supporting the wafer, said chuck including a plurality of distinct regions filled with fluid, the fluid at each said region heated independently to a selected temperature by means of a recirculating fluid temperature control system,
each region positioned adjacent to each preset location on the wafer; and a controller coupled to said measuring device and said temperature controlled chuck, said controller adjusting the temperature of the fluid in each region during a process to reduce the variation of etched features among said plurality of preset locations.

* * * * *

UNITED STATES PATENT AND TRADEMARK OFFICE
CERTIFICATE OF CORRECTION

PATENT NO. : 6,770,852 B1
DATED : August 3, 2004
INVENTOR(S) : Steger

It is certified that error appears in the above-identified patent and that said Letters Patent is hereby corrected as shown below:

Title page,
Item [56], References Cited, U.S. PATENT DOCUMENTS, "5,059,770" reference, remove the "*".
Item [57], ABSTRACT,
Line 13, replace "each" with -- the --.

Column 10,
Line 16, after "features along" remove "the".

Signed and Sealed this

Twenty-sixth Day of July, 2005

JON W. DUDAS
*Director of the United States Patent and Trademark Office*